US011799221B2

(12) United States Patent
Sun et al.

(10) Patent No.: US 11,799,221 B2

(45) Date of Patent: Oct. 24, 2023

(54) FAN CONNECTOR STRUCTURE

(71) Applicant: ASIA VITAL COMPONENTS CO., LTD., New Taipei City (TW)

(72) Inventors: Sung-Wei Sun, New Taipei City (TW); Ming-Che Lee, New Taipei City (TW)

(73) Assignee: ASIA VITAL COMPONENTS CO., LTD., New Taipei City (TW)

( * ) Notice: Subject to any disclaimer, the term of this patent is extended or adjusted under 35 U.S.C. 154(b) by 70 days.

(21) Appl. No.: 17/465,802

(22) Filed: Sep. 2, 2021

(65) Prior Publication Data

US 2023/0061299 A1 Mar. 2, 2023

(51) Int. Cl.

| | |
|---|---|
| ***H01R 13/50*** | (2006.01) |
| ***H01R 12/70*** | (2011.01) |
| ***H01R 12/71*** | (2011.01) |
| *H05K 7/20* | (2006.01) |

(52) U.S. Cl.

CPC ....... *H01R 12/7082* (2013.01); *H01R 12/7076* (2013.01); *H01R 12/718* (2013.01); *H01R 13/50* (2013.01); *H05K 7/20136* (2013.01)

(58) Field of Classification Search

CPC ............. H01R 12/7082; H01R 12/7076; H01R 12/718; H01R 13/50; H05K 7/20136

See application file for complete search history.

(56) References Cited

U.S. PATENT DOCUMENTS

| | | | | |
|---|---|---|---|---|
| 10,948,246 | B1* | 3/2021 | Hsien et al. | G06F 1/20 |
| 2008/0093056 | A1* | 4/2008 | Hwang et al. | H01L 23/427 257/E23.099 |
| 2016/0013696 | A1* | 1/2016 | Aiello et al. | F04D 25/0613 310/91 |
| 2018/0238338 | A1* | 8/2018 | Tamaoka et al. | F04D 29/162 |
| 2018/0242924 | A1* | 8/2018 | Barker et al. | G06F 1/20 |
| 2019/0334303 | A1* | 10/2019 | Kim et al. | H02K 11/33 |
| 2021/0084792 | A1* | 3/2021 | Hsien et al. | F04D 29/4226 |
| 2021/0089094 | A1* | 3/2021 | Watamura et al. | G06F 1/203 |
| 2021/0151875 | A1 | 5/2021 | Samardzija et al. | |
| 2021/0226391 | A1* | 7/2021 | Hung | H01R 13/6581 |
| 2021/0306538 | A1* | 9/2021 | Solar | H05K 7/2039 |
| 2021/0373624 | A1* | 12/2021 | Schnell et al. | H05K 7/20136 |
| 2021/0405699 | A1* | 12/2021 | Yang et al. | G06F 1/1616 |
| 2022/0015260 | A1* | 1/2022 | Uchino et al. | H05K 7/20136 |
| 2022/0030741 | A1* | 1/2022 | Embleton et al. | G06F 1/182 |
| 2022/0225530 | A1* | 7/2022 | Ku et al. | H05K 7/20136 |
| 2022/0231718 | A1* | 7/2022 | Stewart et al. | H05K 7/20136 |
| 2022/0382345 | A1* | 12/2022 | Chen et al. | H05K 7/20136 |

FOREIGN PATENT DOCUMENTS

| | | | |
|---|---|---|---|
| CN | 104847680 | B | 1/2018 |
| TW | 484758 | U | 4/2002 |
| TW | M621121 | U | 12/2021 |

OTHER PUBLICATIONS

Search Report dated Jun. 14, 2022 issued by Taiwan Intellectual Property Office for counterpart application No. 110131103.

* cited by examiner

*Primary Examiner* — Abdullah A Riyami
*Assistant Examiner* — Nelson R. Burgos-Guntin
(74) *Attorney, Agent, or Firm* — Demian K. Jackson; Jackson IPG PLLC

(57) ABSTRACT

A fan connector structure is applicable to a system circuit board having a circuit board-end connector provided thereon and includes a fan having a fan frame main body and a fan-end connector projected from an outer side of the fan frame main body. The fan-end connector and the fan frame main body can be selectively integrally or non-integrally formed with each other. The fan-end connector is correspondingly connectable to the circuit board-end connector, so as to realize the purpose of automated and quick assembling of the fan to the system circuit board with less labor and time cost.

4 Claims, 4 Drawing Sheets

FAN CONNECTOR STRUCTURE

FIELD OF THE INVENTION

The present invention relates to the field of fan, and more particularly, to a fan connector structure that can be quickly assembled to a system circuit board to realize the purpose of automated assembling and save labor and time cost while ensuring uniform assembling quality.

BACKGROUND OF THE INVENTION

A fan is a common system heat dissipation device frequently applied to electronic equipment to provide the effect of forced heat dissipation. Generally, the fan is electrically connected to a motherboard (i.e. a system circuit board) of the electronic equipment to receive transmitted signal and power in order to obtain required power supply and achieve signal feedback control.

Please refer to FIG. 1. Generally, a conventional fan 4 includes a connector 42, which is electrically connected to a fan circuit board (not shown in FIG. 1) via a plurality of wires 43. The connector 42 connected to outer ends of the wires 43 is exposed to and dangling at an outer side of a fan frame 41. To mount the fan 4 to a motherboard 51 of the electronic equipment, the connector 42 must be plugged onto a plurality of metal terminals 511 pre-formed on the motherboard 51 to electrically connect the fan 4 to the electronic equipment. Therefore, after the fan 4 has been fixed to the motherboard 51 of the electronic equipment, the dangling connector 42 has to be manually plugged onto the metal terminals 511 on the motherboard 51 to complete the entire assembling of the fan 4 to the motherboard 51.

Since the connector 42 of the conventional fan 4 is an element separated from the fan frame 41 and is connected to the fan frame 41 via exposed and loosely wires 43, it is impossible to assemble the fan 4 to the motherboard 51 of the electronic equipment with automated processing equipment. That is, the connector 42 of the fan 4 has to be manually plugged onto the metal terminals 511 on the motherboard 51. Thereafter, the exposed wires 43 also have to be manually aligned and trimmed. In other words, the entire process of setting and assembling the connector 42 and the wires 43 of the conventional fan 4 is completed manually. In a mass production of the fan 4, it is inevitable to consume a considerably large quantity of labor and manufacturing time to increase the manufacturing cost. In addition, the exposed wires 43 after alignment and trimming would still have some redundant sections (i.e. excessive lengths of conductors) loosely stretched between the fan 4 and the motherboard 51 to interfere with smooth airflow in the internal space of the system and cause dust absorption or dustfall.

In view that the connectors of the conventional fan 4 and the motherboard 51 are manually assembled without the possibility of automated production, which results in consumption of labor and time, increased manufacturing cost and inconsistent assembling quality, it is an important goal of persons skilled in the art to solve these problems.

SUMMARY OF THE INVENTION

A primary object of the present invention is to provide a fan connector structure, which can be quickly assembled to a system circuit board to realize the purpose of automated assembling and save labor and time cost while ensuring uniform assembling quality.

Another object of the present invention is to provide a fan connector structure that eliminates redundant fan wires disorderly extended between a fan and a system circuit board.

To achieve the above and other objects, the fan connector structure according to the present invention is applicable to a system circuit board having a circuit board-end connector. The fan connector structure includes a fan having a fan frame main body and a fan-end connector projected from an outer side of the fan frame main body. The fan-end connector and the fan frame main body can be selectively integrally or non-integrally formed with each other. The fan-end connector is correspondingly connectable to the circuit board-end connector. With the above arrangements, it is possible to realize the purpose of automated and quick assembling of the fan-end connector to the circuit board-end connector to save labor and time cost.

The fan frame main body includes an upper cover and a base seat correspondingly connected to each other, and a sidewall provided between the upper cover and the base seat and located along an outer periphery of the fan frame main body. The fan-end connector can be selectively integrally or non-integrally formed with one of the sidewall and the base seat. The fan-end connector is projected from an outer side of the sidewall in a vertical or a horizontal direction relative to the sidewall; or the fan-end connector is projected from an outer side of the base seat in a vertical or a horizontal direction relative to the base seat.

In the case the fan-end connector is integrally formed with the fan frame main body by injection molding, the fan-end connector is directly located at the outer side of the fan frame main body. In the case the fan-end connector is non-integrally formed with the fan frame main body, the fan-end connector and fan frame main body are two mating structures connected to each other to form a unit. The two mating structures can be one recessed structure and one corresponding protruded structure, two snap-in structures, two screw-connected structures, two press-fit structures, two fastened structures, two adhered structures, or two glued structures.

The fan-end connector has a plurality of connecting pins; and the connecting pins are located in the fan-end connector and electrically connected to a fan circuit board of the fan. One of the fan-end connector and the circuit board-end connector is a plug while the other one of them is a socket corresponding to the plug.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with a preferred embodiment thereof and by referring to the accompanying drawings.

Figure 1:
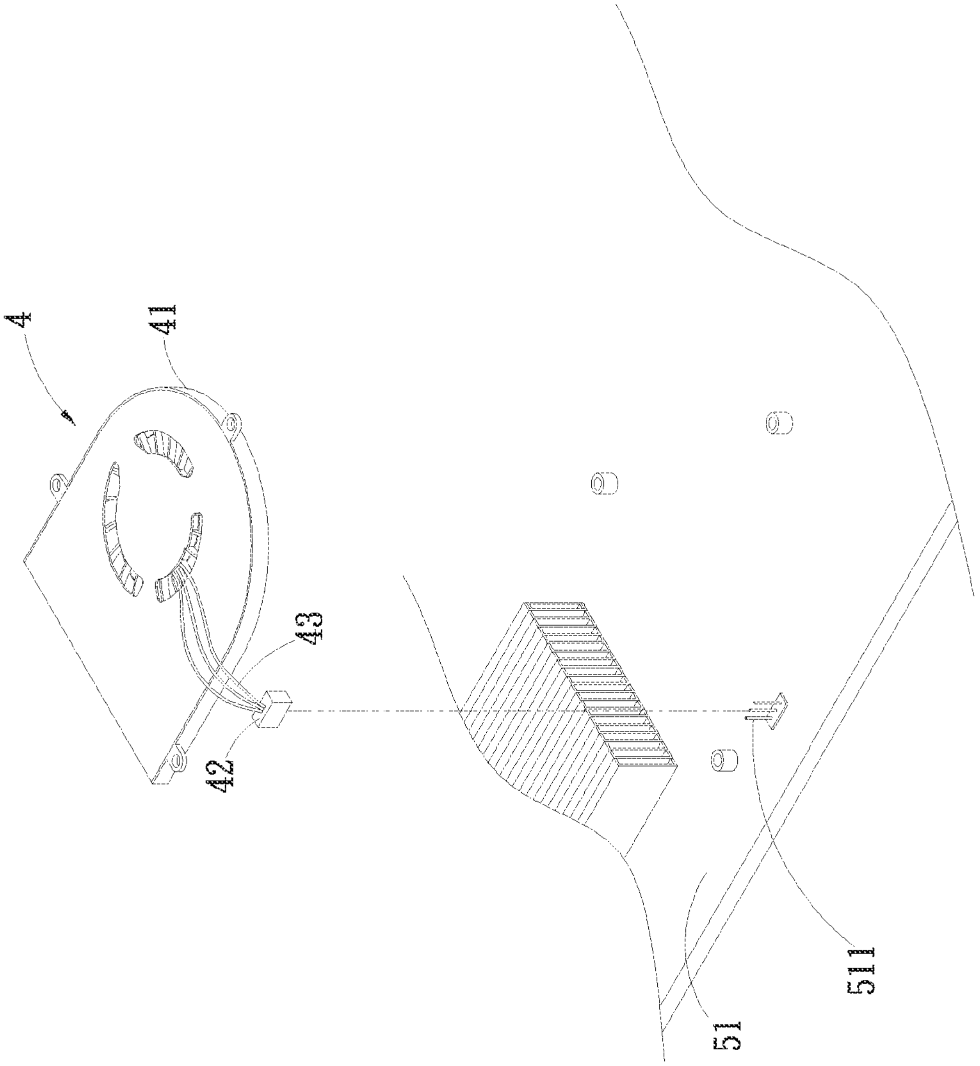
FIG. 1 is a schematic view showing the manner in which a conventional fan is connected to a system motherboard.
Figure 2:
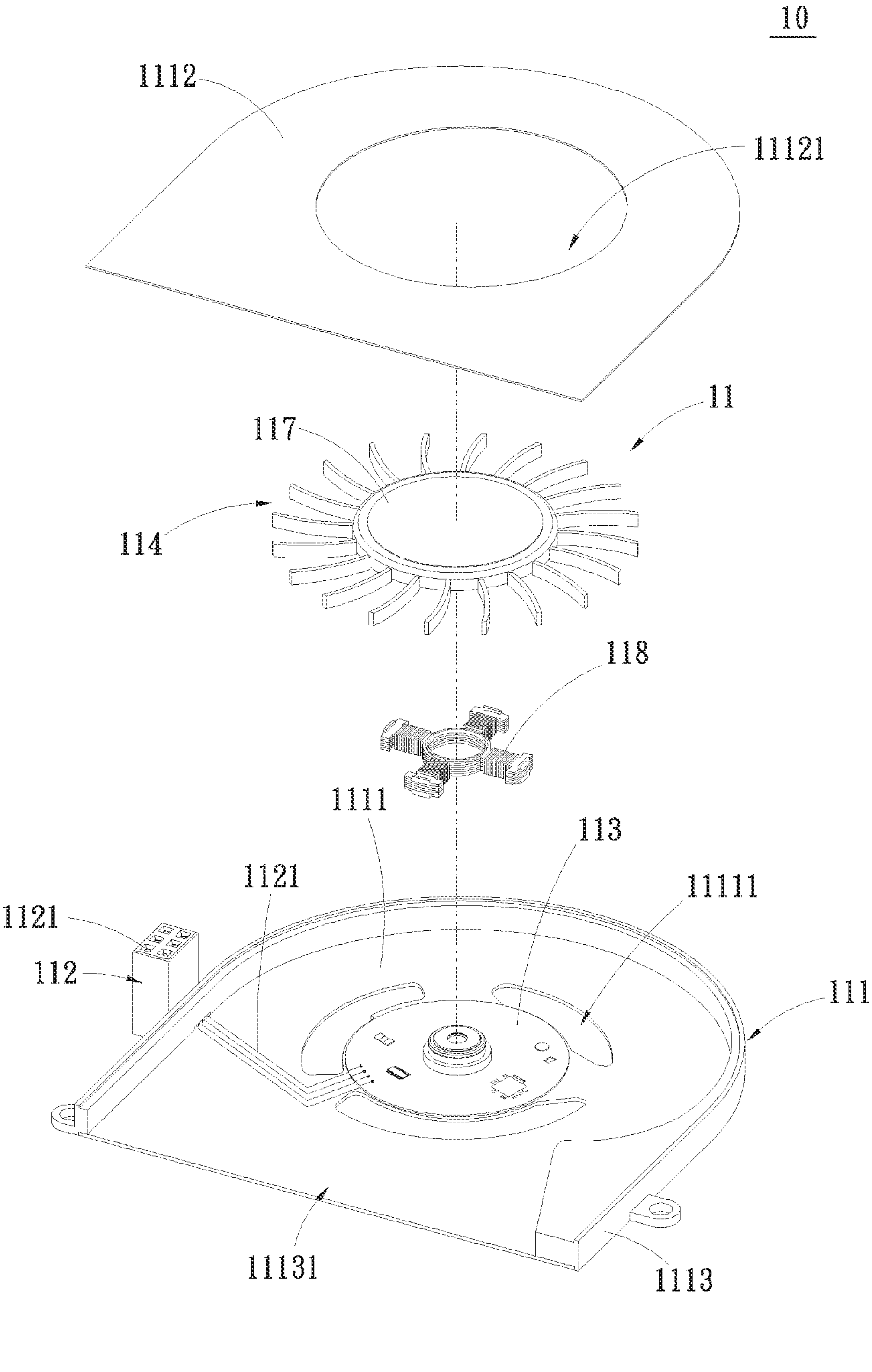
FIG. 2 is an exploded perspective view of a fan connector structure according to a preferred embodiment of the present invention.
Figure 3:
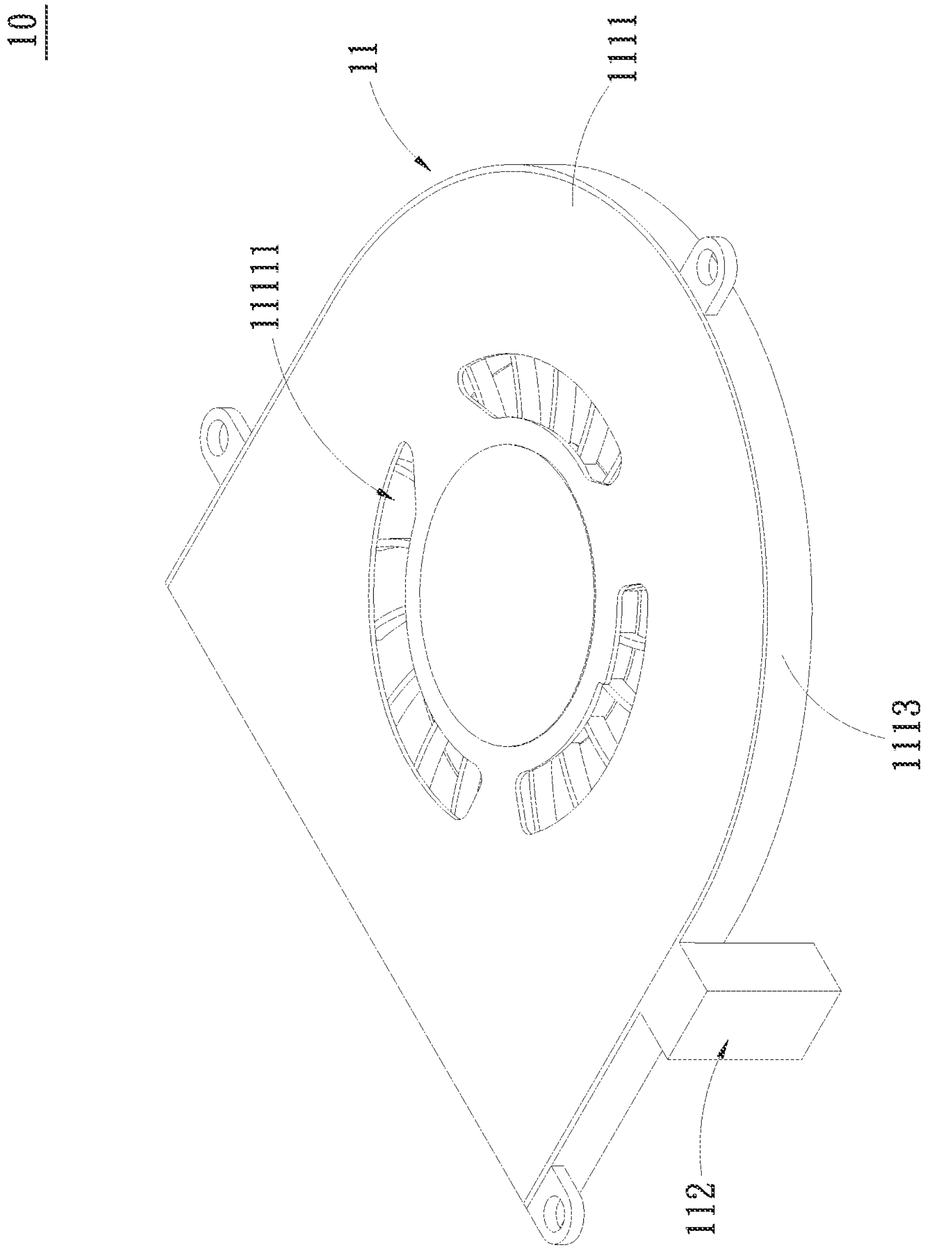
FIG. 3 is an assembled view of FIG. 2.
Figure 4:
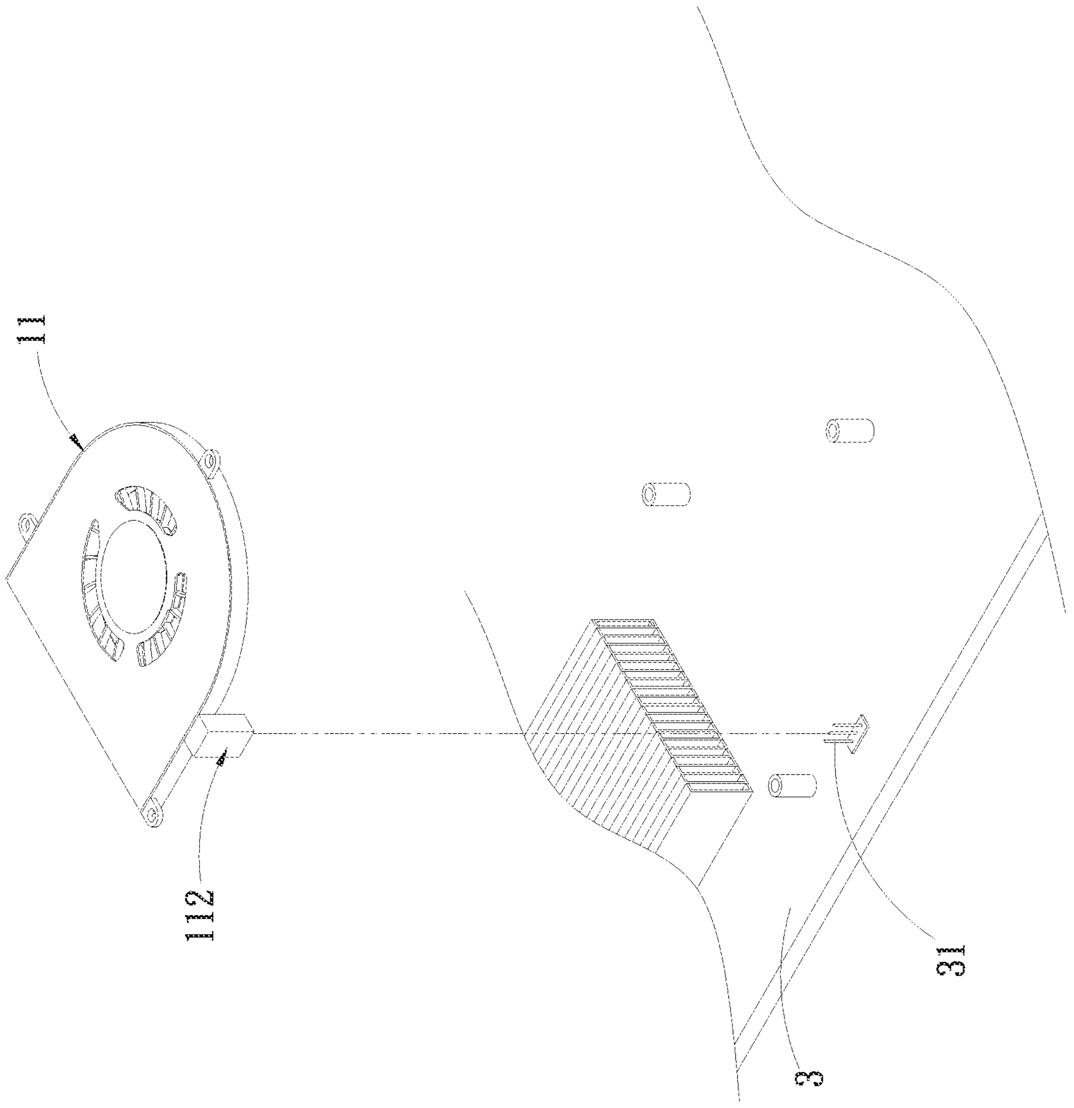
FIG. 4 is a schematic view showing the manner in which the fan with the fan connector structure of the present invention is assembled to a system circuit board.

The present invention relates to a fan connector structure. Please refer to FIGS. 2 and 3 along with FIG. 4. As shown, a fan connector structure 10 according to a preferred embodiment of the present invention is applicable to a system circuit board 3 having a circuit board-end connector 31 electrically connected to the system circuit board 3. In the illustrated preferred embodiment, the system circuit board 3 is a motherboard of a computer system. In practical implementation of the present invention, the system circuit board 3 may also be a motherboard of other electronic devices, such as a laptop computer, a portable device, a communication cabinet or a server.

The fan connector structure 10 of the present invention includes a fan 11, which can be a centrifugal fan or an axial fan. In the illustrated embodiment, the fan 11 is a centrifugal fan including a fan frame main body 111. The fan frame main body 111 includes an upper cover 1112 correspondingly connected to a base seat 1111. A sidewall 1113 is provided between the upper cover 1112 and the base seat 1111 and located along an outer periphery of the fan frame main body 111. The sidewall 1113 is formed with the base seat 1111 by injection molding and is upward extended toward the upper cover 1112. Alternatively, the sidewall 1113 can be formed with the upper cover 1112 by injection molding and is extended toward the base seat 1111. In another operable embodiment, the sidewall 1113 can be selectively a separate element and connected to the upper cover 1112 and the base seat 1111. The upper cover 1112 and the base seat 1111 are respectively provided with a wind inlet 11121, 11111, while the sidewall 1113 is provided with a wind outlet 11131. In the fan frame main body 111, there are provided a fan propeller 114, a rotor 117, a stator 118 and a fan circuit board 113. The fan propeller 114 is located corresponding to the wind inlets 11111, 11121, the fan circuit board 113 is located below the fan propeller 114, the rotor 117, which includes an annular magnet and an iron case, is located at a radially inner side of the fan propeller 114, and the stator 118 is located above the fan circuit board 113 and is located corresponding to but spaced from the rotor 117. The stator 118 is electrically connected to the fan circuit board 113. When the stator 118 and the rotor 117 are excited due to mutual induction, the rotor 117 is driven to rotate the fan propeller 114.

A fan-end connector 112 is projected from an outer side of the fan frame main body 111. The fan-end connector 112 can be integrally or non-integrally formed with the fan frame main body 111. That is, the fan-end connector 112 can be integrally or non-integrally formed with the sidewall 1113 to project from an outer side of the sidewall 1113 in a vertical or a horizontal direction relative to the sidewall 1113, or be integrally or non-integrally formed with the base seat 1111 to project from an outer side of the base seat 1111 in a vertical or a horizontal direction relative to the base seat 111. In the illustrated embodiment, the fan-end connector 112 can be selectively injection molded along with the sidewall 1113 to be located at the outer side of the sidewall 1113. However, it is understood the present invention is not particularly limited thereto. In practical implementation of the present invention, it is also possible to selectively form the fan-end connector 112 on an outer side of the base seat 1111 by injection molding the fan-end connector 112 along with the base seat 1111. Alternatively, the fan-end connector 112 and the sidewall 1113 or the base seat 1111 are not formed as an integral structure but two mating structures, such as one recessed and one correspondingly protruded structure, two screw-connected structures, two press-fit structures, two adhered structures, two snap-fit structures or two glued structures, which are connected to each other to form a unit. In an embodiment, the fan-end connector 112 is a connector plug and the circuit board-end connector 31 is a corresponding connector socket or a set of corresponding pins. In another embodiment, the fan-end connector 112 is a connector socket or a set of pins while the circuit board-end connector 31 is a corresponding connector plug.

The fan-end connector 112 has a plurality of connecting pins 1121 located in the fan-end connector 112. The connecting pins 1121 respectively have an end inserted into the circuit board-end connector 31 to electrically connect to a plurality of pins of the circuit board-end connector 31, and another end directly extended to the fan circuit board 113 and electrically connected thereto. Alternatively, it is possible for the other ends of the connecting pins 1121 to directly electrically connect to the fan circuit board 113 in the fan frame main body 11 via a wire set or a circuit layout.

When the fan 11 is positioned on the system circuit board 3, the fan-end connector 112 is simultaneously brought to move closer to the system circuit board 3 and into a location corresponding to the circuit board-end connector 31. At this point, a downward force can be applied to the outer bottom side of the base seat 1111 of the fan 11 and the fan-end connector 112, and the fan-end connector 112 can be directly and quickly plugged onto and electrically connected to the circuit board-end connector 31. Therefore, it is able to realize automated assembling of the fan 11 to the system circuit board 3.

Generally, for the purpose of assembling the fan 11 to the system circuit board 3, a mount corresponding to the fan 11 is provided on the system circuit board 3. Then, the fan 11 and the system circuit board 3 can be connected to each other by different means, such as screw fastening, clamping or snapping.

With the above design of integrally or non-integrally forming a fan-end connector 112 at an outer side of the fan frame main body 111 of the fan 11, it is able to effectively solve the problem in the conventional fan that redundant fan wires are loosely extended between the fan and the system circuit board and disorderly exposed from the fan frame. Further, in the present invention, the fan-end connector 112 is moved along with the fan 11 toward the system circuit board 3, so that the fan-end connector 112 can be quickly connected to the circuit board-end connector 31 to save assembling time and wire cost while ensuring uniform assembling quality. In this manner, it is possible to realize the objectives of automated assembling and saving labor cost.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A fan connector structure applicable to a system circuit board having a circuit board-end connector provided thereon, comprising:

a fan including a fan frame main body and a fan-end connector projected from an outer side of the fan frame main body; the fan frame main body including an upper cover and a base seat correspondingly connected to each other, and a sidewall provided between the upper cover and the base seat and located along an outer periphery of the fan frame main body; the fan-end connector and the fan frame main body being integrally formed on the sidewall; the fan-end connector being projected from the base seat to the upper cover, such that when the fan is positioned on the system circuit board the fan-end connector is simultaneously brought to move closer to the system circuit board and correspondingly directly connected to the circuit board-end connector.

2. The fan connector structure as claimed in claim 1, wherein the fan-end connector is integrally formed with the fan frame main body by plastic injection molding to be located at the outer side of the fan frame main body.

3. The fan connector structure as claimed in claim 1, wherein the fan-end connector has a plurality of connecting pins; and the connecting pins being located in the fan-end connector and electrically connected to a fan circuit board of the fan.

4. The fan connector structure as claimed in claim 1, wherein one of the fan-end connector and the circuit board-end connector is a plug while the other one of them is a socket corresponding to the plug.

* * * * *